United States Patent [19]

Lezan et al.

[11] Patent Number: 5,338,994
[45] Date of Patent: Aug. 16, 1994

[54] METHOD AND APPARATUS FOR ACHIEVING CURRENT BALANCE IN PARALLEL CONNECTED SWITCHING DEVICES

[75] Inventors: Georges R. E. Lezan, Roanoke; Loren H. Walker, Salem, both of Va.

[73] Assignee: General Electric Company, Schenectady, N.Y.

[21] Appl. No.: 71,375

[22] Filed: Jun. 4, 1993

Related U.S. Application Data

[63] Continuation of Ser. No. 779,124, Oct. 16, 1991, abandoned, which is a continuation of Ser. No. 382,942, Jul. 20, 1989, abandoned.

[51] Int. Cl.$^5$ .................. H02J 1/14; H02J 3/06; H03K 17/72
[52] U.S. Cl. ........................ 307/86; 307/34; 307/52; 307/633; 363/70
[58] Field of Search ............... 307/55, 58, 60, 32, 307/18–29, 45, 52, 53, 64, 82, 85–87, 491, 633, 131, 645, 640, 242, 246, 33, 34, 38; 323/271, 272, 910; 363/70, 54, 72, 69, 71, 87, 96, 129, 137, 56, 57, 135, 138

[56] References Cited

U.S. PATENT DOCUMENTS

| | | | |
|---|---|---|---|
| 3,633,046 | 1/1972 | Dewey | 307/645 |
| 3,665,293 | 5/1972 | Keiler et al. | 323/24 |
| 3,693,069 | 9/1972 | Kelly, Jr. et al. | 323/24 |
| 4,194,147 | 3/1980 | Payne et al. | 323/17 |
| 4,313,155 | 1/1982 | Bock et al. | 363/21 |
| 4,512,561 | 9/1986 | Kimura et al. | 357/38 |
| 4,748,397 | 5/1988 | Ogawa et al. | 323/222 |
| 4,831,288 | 5/1989 | Chida et al. | 307/633 |
| 4,912,621 | 3/1990 | Kobayashi et al. | 363/71 |
| 4,926,306 | 5/1990 | Ueda et al. | 363/58 |

*Primary Examiner*—A. D. Pellinen
*Assistant Examiner*—Richard T. Elms
*Attorney, Agent, or Firm*—Bell, Seltzer, Park & Gibson

[57] ABSTRACT

A scheme for maintaining current balance within a plurality of semiconductor devices, particularly thyristors and gate turn-off thyristors, which plurality is connected between two electrical power sources which devices are configured to be simultaneously conductive to share the current between the two sources, employs the scheme for maintaining the current within the several devices of the plurality equal. The scheme provides for the generation of individual current signals which represent the individual current magnitudes within the several devices. Further generated is an average current signal representing the average current within the plurality. A difference signal is generated with respect to each of the individual current signals which represents the difference between the average and the individual current signal. The difference signal is then employed to vary the time of application of the next control signal to the associated one of the devices to thereby minimize current imbalance within the plurality.

33 Claims, 13 Drawing Sheets

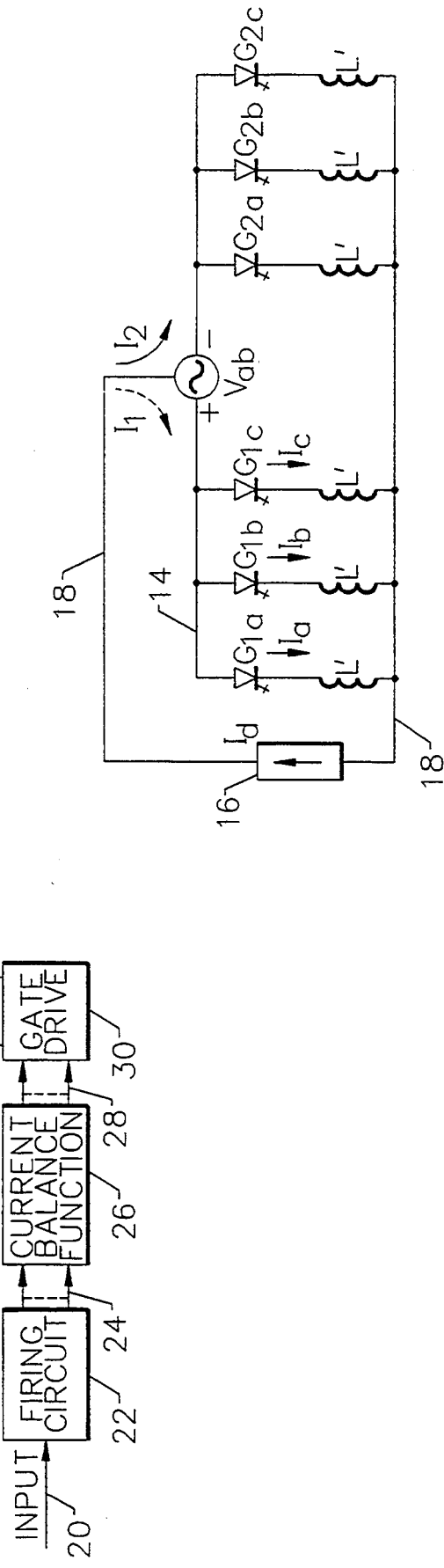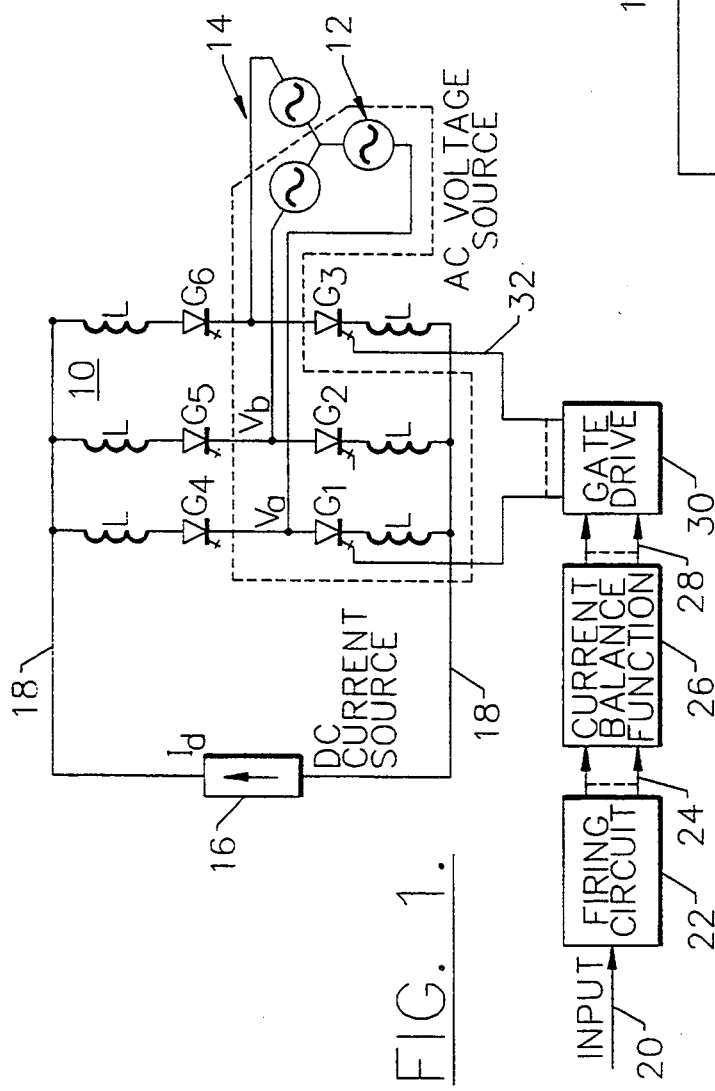

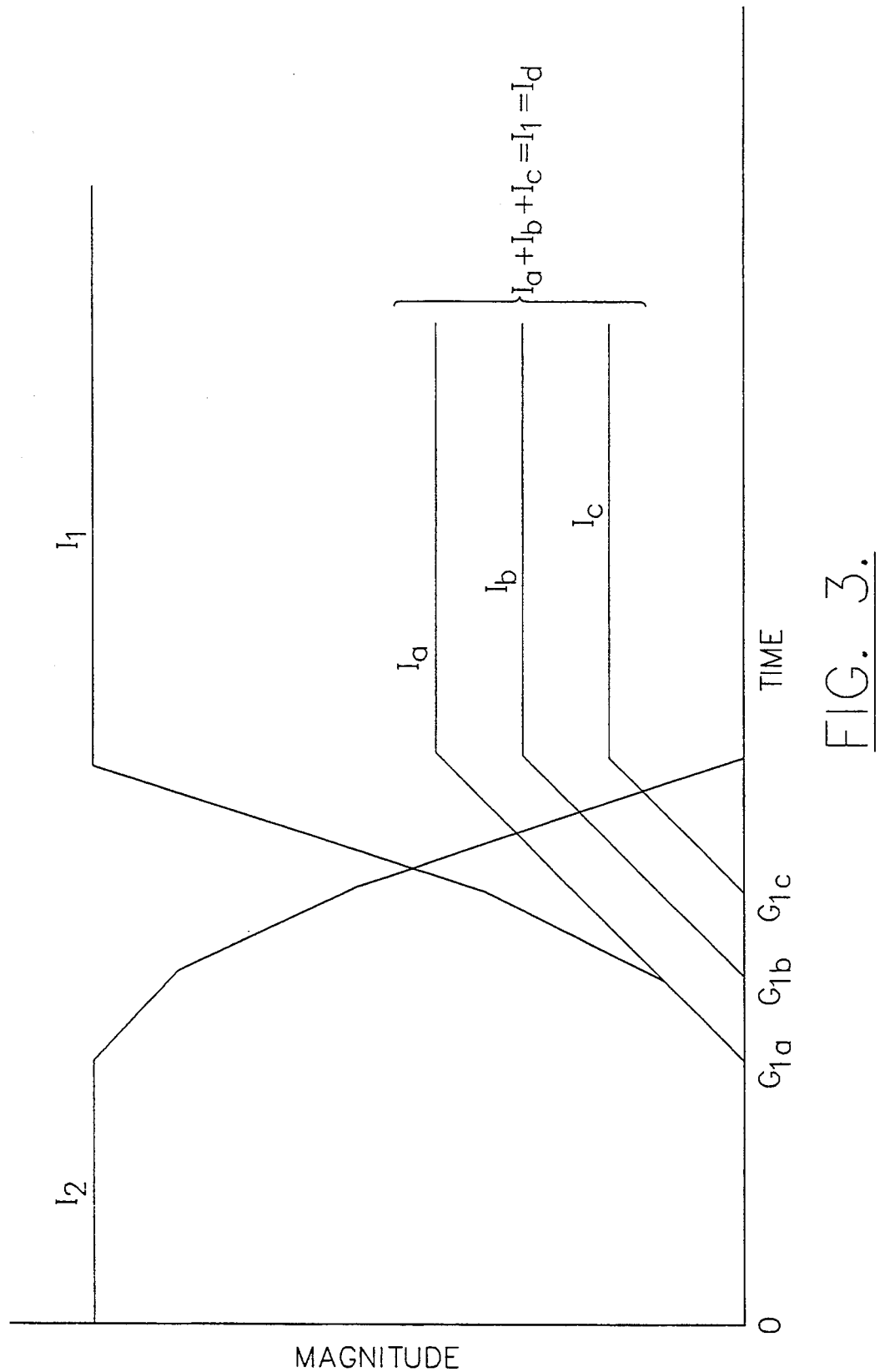

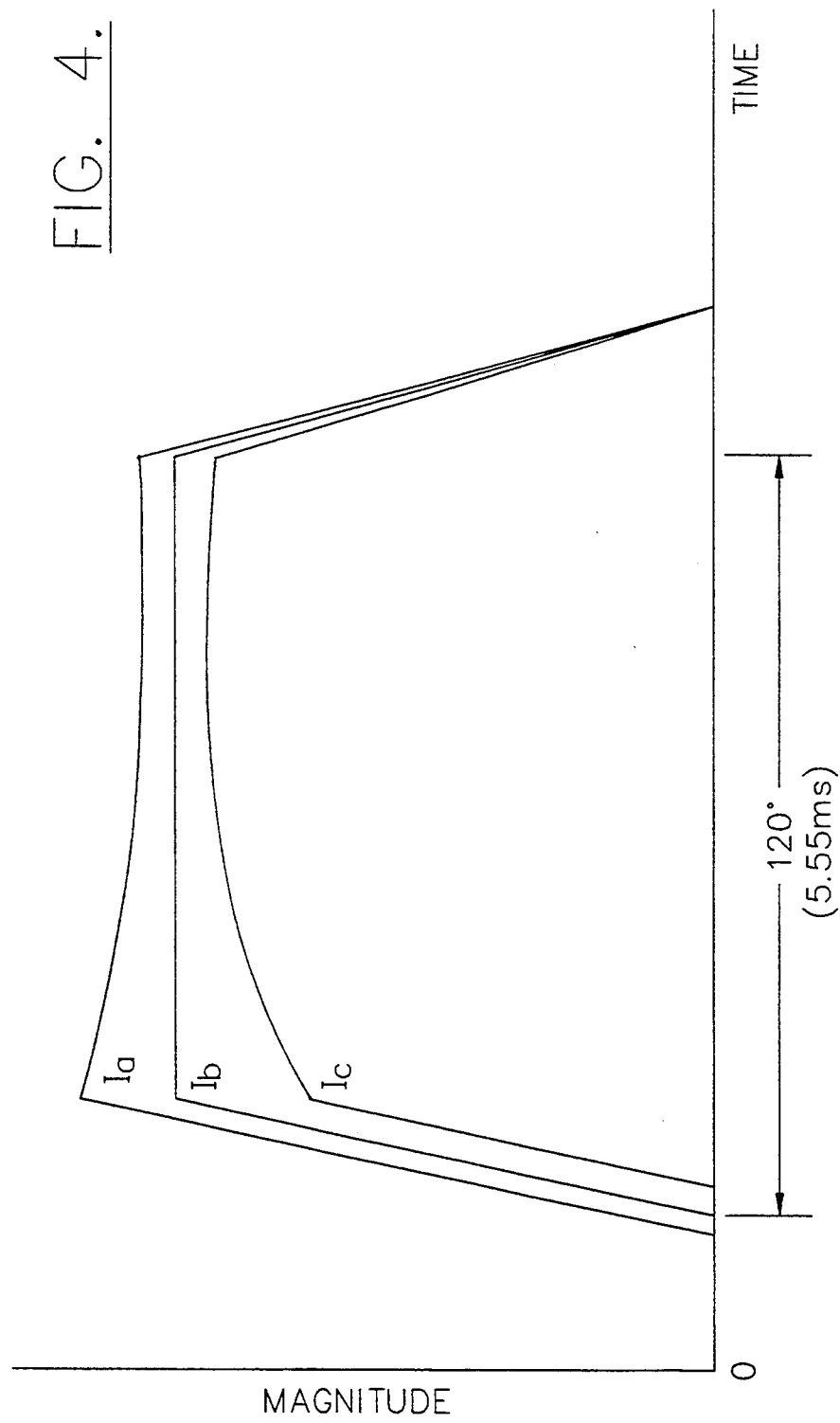

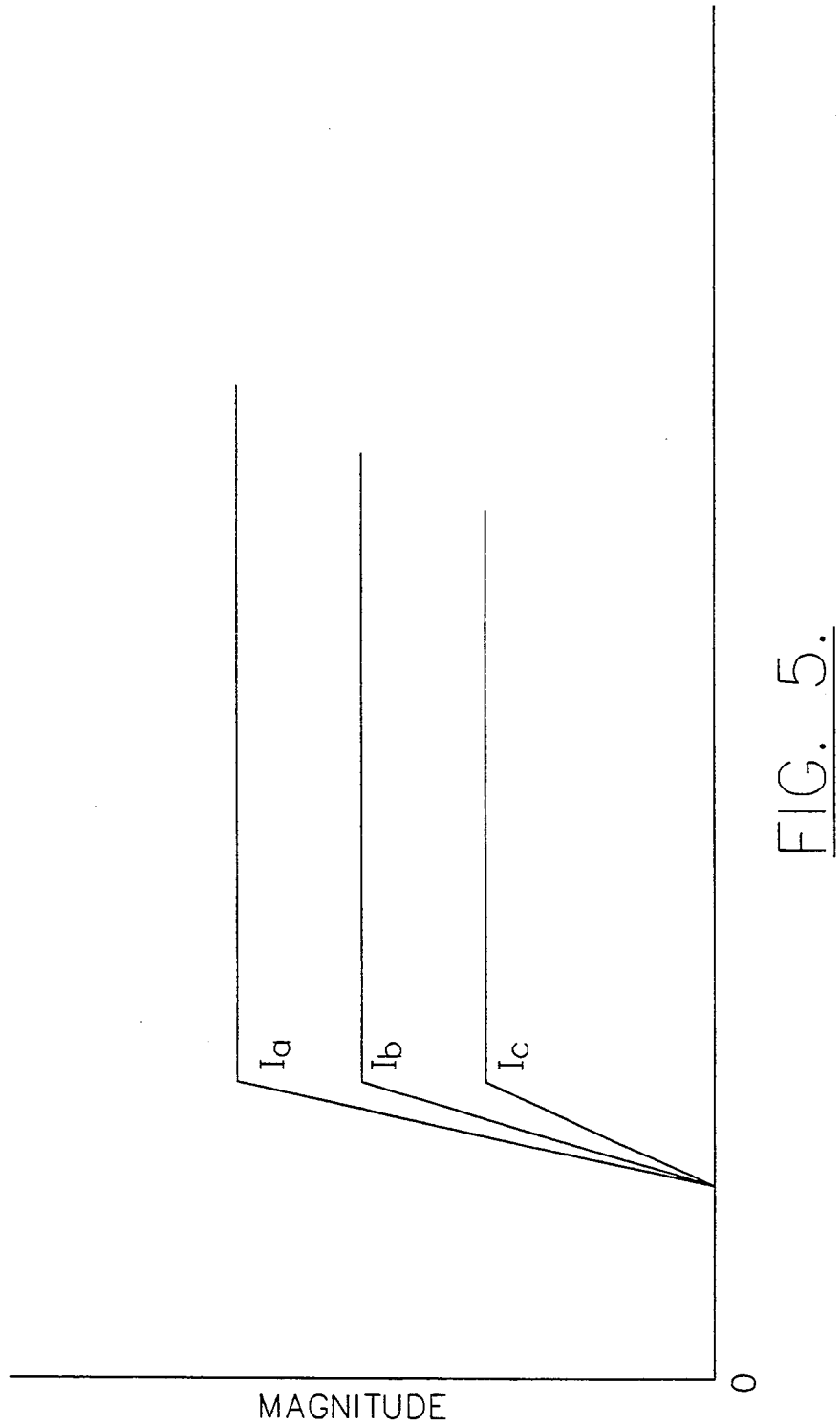

METHOD AND APPARATUS FOR ACHIEVING CURRENT BALANCE IN PARALLEL CONNECTED SWITCHING DEVICES

BACKGROUND OF THE INVENTION

This invention was made with Government support under prime contract number DNA001-88-C-0028 (subcontract 19399-TSA-2) awarded by the Department of Defense. The Government has certain rights in this invention.

This is a continuation of co-pending application(s) Ser. No. 07/779,124 filed Oct. 16, 1991 (now abandoned) which is a continuation of Ser. No.07/382,942 filed Jul. 20, 1989 (now abandoned).

The present invention relates generally to switching systems and more particularly to a method and apparatus for minimizing current imbalance in a plurality of switching devices connected in parallel between two electrical power sources and adapted to transfer electrical power between the two sources.

There are a number of applications where, because of current ratings, two or more switching devices are connected in parallel and configured to be simultaneously conductive to transfer electrical power between a source and a load, the latter in certain applications also representing a source during certain phases of circuit operation. An example of such an application is shown in U.S. Pat. No. 5,051,603—"Method and Apparatus for Matching Turn-Off times of Parallel Connected Semiconductor Switching Devices" by Loren H. Walker, issued Sep. 24, 1991 and assigned to the assignee of the present invention. When the switching devices are of the non-proportional, semiconductor type [especially thyristors including thyristors of the gate turn-off (GTO) type], it is desired to maintain, to the degree practical, current balance between the several devices of the plurality combination. Balance within the several devices permits utilizing devices in applications closer to their individual ratings since the devices must, at least, be sized for worst case normal conditions.

Current imbalance within parallel connected switching devices can result from a number of factors. Primarily among these factors, which will be discussed in more detail later, are (a) differences in turn-on time between the devices, (b) differences in the inductance of the bus associated with the devices, (c) differences in the bus resistance, and (d) differences in the forward voltage drop of the devices.

One known scheme for minimizing current imbalance in these situations employs large iron core magnetic elements. This results in space requirements, electrical losses and additional expense.

SUMMARY OF THE INVENTION

It is, therefore, an object of the present invention to provide an improved power switching system.

It is an additional object to provide an improved power switching system employing a plurality of parallel connected switch devices in which current imbalance is minimized.

It is a further object to provide, in a power switching system, an improved scheme for maintaining current balance within parallel connected semiconductor switching devices connected between two electrical power sources.

It is another object to provide an improved scheme for maintaining current balance within a plurality of parallel connected thyristors, configured to be simultaneously and substantially coincidentally conductive, connected between two power sources.

It is a still further object to provide an improved scheme for maintaining current balance within parallel connected thyristors by varying the turn-on time of the individual thyristors based upon the relative values of the current during the previous conduction period.

It is another object to provide a scheme for maintaining current balance within parallel connected thyristors without the inclusion of large iron cored magnetic elements.

The foregoing and other objects are obtained, in accordance with the present invention, by providing a power switching system which employs a plurality of switching devices connected in parallel between two power sources. (The term power source is herein used in its true sense since either of the two may, at any particular moment be a supply or a sink of electrical power.) The devices are configured to be simultaneously conductive and are rendered individually conducting in response to the application of respective control signals. Current balance is maintained within the several switching devices by a scheme which provides for the development of individual current signals, respectively representing the current magnitude within the individual devices. There is also developed an average current signal which represents the average of all the individual currents within a plurality. A difference signal, derived as a function of any difference between the individual signal and the average signal is provided for each of the devices and, based upon that difference signal at a first conducting period, the time of rendering conductive the switching device associated with that difference signal is varied for the next conduction period.

BRIEF DESCRIPTION OF THE DRAWING

While the present invention is defined in particularity in the claims annexed to and forming a part of this specification, a better understanding of the invention can be had from the following description taken in conjunction with the accompanying drawing in which:

FIG. 1 is an schematic diagram illustrating a typical power switching environment incorporating the present invention;

FIG. 2 is a schematic diagram illustrating a portion of the bridge circuit of FIG. 1 in greater detail and useful in understanding the present invention;

FIGS. 3 through 8 are graphical representations illustrating various circuit relationships and useful in understanding the present invention;

DETAILED DESCRIPTION

Figure 6:
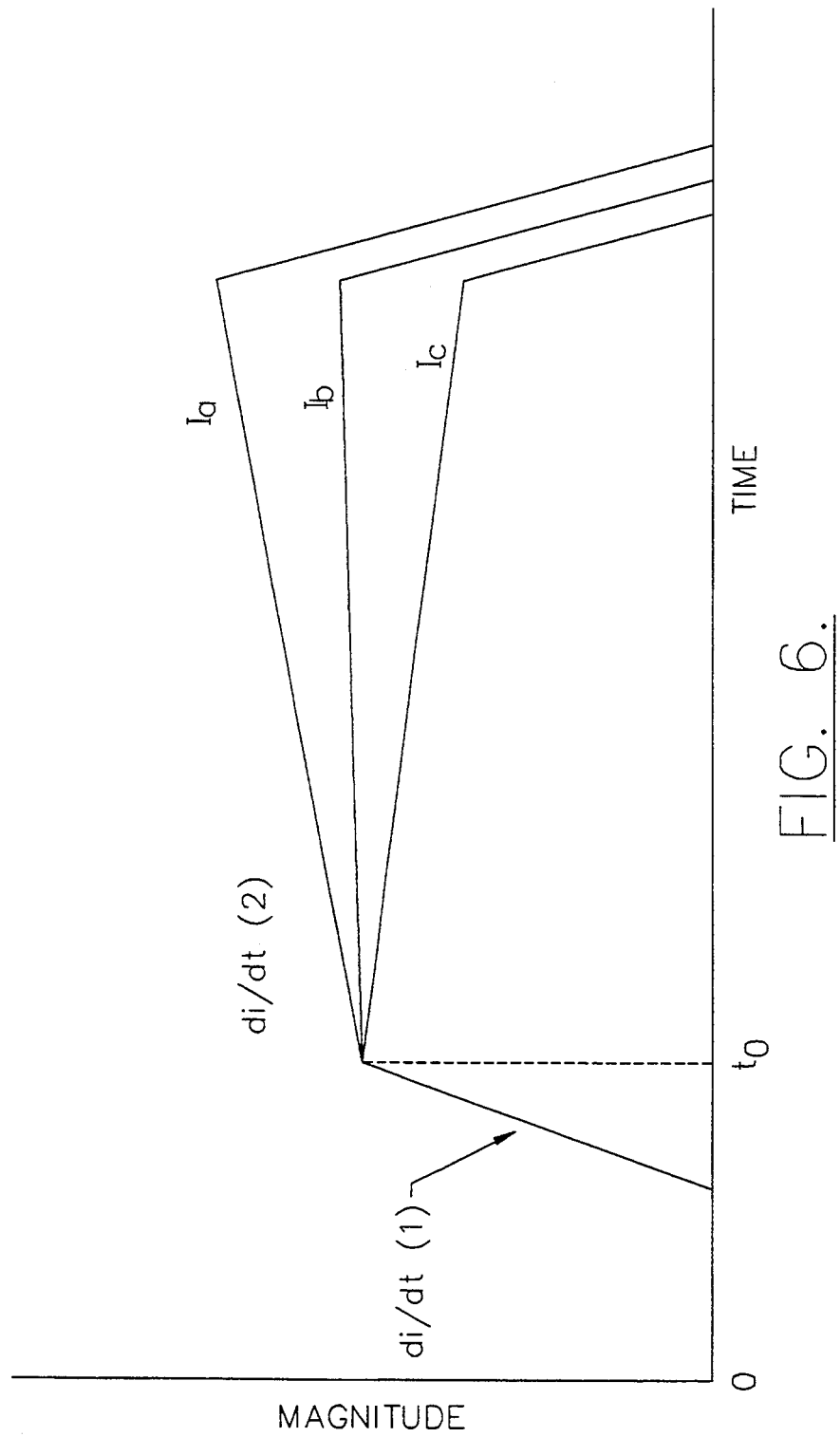

Reference is now made to FIG. 1 which illustrates a typical scheme for use with and including the current balance function of the present invention. For purposes of illustration, an array of switching devices is disposed in a three phase bridge 10 comprised of six switching devices, shown as gate turn-off thyristors (GTOs) labeled $G_1$–$G_6$. (As earlier indicated, the present invention is generally applicable to non-proportional devices. Because of the particular characteristics of the GTO, they have been used for purpose of illustration. Thus, while the following description will often be couched in terms of the GTO, the invention is not to be considered as limited thereby.) Included in series with each of the GTOs, $G_1$–$G_6$, is a series inductance L. The junction point of each pair of series connected GTOs (e.g. $G_1$ and $G_4$) is connected via a bus 14 to an first power source shown as AC voltage source 12, illustrated as a three phase source connected in a wye configuration. A second power source shown as DC current source 16 is connected by way of the two lines of a DC bus 18 to the bridge 10 all in a manner well known in the art. The DC current source 16 provides a current $I_d$ which will exist variously within the GTOs, $G_1$–$G_6$. It should be noted that while element 16 is indicated as a DC current source in accordance with the true designation of the present invention, in a more conventional sense, element 16 may be considered as a load such as a large inductance to be supplied by the bridge 10. However, because of its inductive nature, during periods of commutation of devices $G_1$–$G_6$, element 16 will act as a current source.

Control of the switching devices or GTOs, $G_1$–$G_6$, is the result of an input signal on line 20. This signal is only generically pertinent to the present invention and may emanate from any suitable source such as an operator control of automatic or manual nature. The function of the input on line 20 is simply to govern to the overall level of system operation. The input on line 20 is provided to a firing circuit 22 which generates a series of pulses, provided on lines 24, generally designating the time at which the plurality of the devices of the bridge 10 are to be fired (i.e., rendered conductive). In accordance with the present invention, this timing function is affected or modified by the current balance function 26 which is central to the present invention as will be described. The output of the current balance function 26, via lines 28, is applied to gate drivers 30 which form the actual gate pulses to be supplied to the devices of the bridge 10 via lines 32, only two of which are illustrated. With the exception of the included current balance function 26, the total depiction of FIG. 1 is that which is understood by those familiar with the art.

FIG. 2 is an expansion on that portion of FIG. 1 shown within the dash line block plus the inclusion of the DC current source 16 and the DC bus 18. As is known, when the current requirements exceed that of a single switching device, a plurality of such devices having, as nearly as possible, identical characteristics may be connected in parallel. This is shown in FIG. 2 wherein three GTOs, $G_{1a}$, $G_{1b}$, and $G_{1c}$, are depicted and collectively represent GTO $G_1$ of FIG. 1. Similarly GTOs, $G_{2a}$, $G_{2b}$ and $G_{2c}$, represent the GTO $G_2$ in FIG. 1. (It is also recognized that it is common practice, when the voltage requirements exceed the capabilities of a single device such as $G_{1a}$, to provide a series arrangement of devices and thus, each of the GTOs in the FIG. 2 depiction can represent a series arrangement of substantially identical GTOs.) The GTOs here included are connected to the $V_{ab}$ portion of the AC voltage source. An inductor L' is connected in series with each of the GTOs. Typically each of the inductors L' will have approximately three times value of inductance as that of L in FIG. 1. It is, of course, realized that the three GTO showing is arbitrarily and that a lesser number (2) or a greater number could be employed with equal facility.

Looking now to the operation of the FIG. 2 depiction, it will be assumed that a DC current $I_d$ from the source 16 exists (labeled $I_2$) in that basic leg comprised of the GTOs, $G_{2a}$, $G_{2b}$, and $G_{2c}$, and that it is desired to commutate that current to the other basic leg represented by the three GTOs, $G_{1a}$, $G_{1b}$, and $G_{1c}$. This intended commutation is illustrated by the dash line depiction labeled $I_1$. Once this commutation is complete, the respective GTOs will have individual currents $I_a$, $I_b$, and $I_c$ which in sum will equal current $I_d$. Maintaining the balance of these individual currents within the three parallel GTOs is the function of the present invention.

As earlier indicated, the basic factors which may contribute to imbalance (differences) in the currents $I_a$, $I_b$, and $I_c$ are differences in turn-on time, differences in the forward drop cross the semiconductor, differences in bus inductance and differences in bus resistance. The following analysis applies to a set of any number of semiconductors in parallel. Three have been selected for purposes of illustration. It is also assumed, in the following discussion that the GTOs will conduct for 120 electrical degrees.

It is known that if one semiconductor of a parallel connected set has a shorter turn-on time than the others of the set, it is likely to pre-establish a current in itself which will tend to cause its steady state current to be higher than that of the others. This is illustrated in FIG. 3 in which it is assumed that the three semiconductors all have different turn-on times. FIG. 3, which plots the current magnitude as a function of time, shows that GTO $G_{1a}$ turns on first Thus current $I_2$ starts to diminish while $I_1$ tends to increase. When GTOs, $G_{1b}$ and $G_{1c}$ turn on, there are faster decreases in $I_2$ and more rapid increases in $I_1$. When the GTOs $G_{1a}$, $G_{1b}$ and $G_{1c}$ are fully conductive the sum of their currents, $I_1$, will equal the original current $I_d$. The time period which is illustrated in FIG. 3 might, as an example in a 60 Hertz system, extend for approximately 100 microseconds.

FIG. 4 which extends, basically, through 120 electrical degrees (5.55 milliseconds in a 60 Hertz system) shows what happens next. The imbalance in currents, established by the turn-on time differences, will tend to redistribute among the GTOs if there is no other cause of imbalance. The degree to which the redistribution occurs is a function of the time constant of the circuits including the inductance and resistance of the various branches. As a typical example the value of indicator L' may be selected to limit the change in current to some value such as 100 amperes per microsecond. If the voltage $V_{ab}$ is 3000 volts, then L' must be about 15 microhenrys. The resistance of the GTO and inductor may be about 1.1 milliohms. This gives a time constant of $L/R = 13.6$ milliseconds. Since this is about 2.5 times the 5.6 millisecond conduction period, the L/R time constant will not permit full equalization in the 120 electrical degree period. Typically the decay is about forty percent (40%) of the initial imbalance. Thus, under the present situation, there will exist at the end of the anticipated 120 degree conduction period a current imbalance resulting from differences in turn-on time.

Differences in bus inductance, which may result from the bus itself and/or variations in the individual inductances L' will also have an effect on the currents which are established in each GTO. This effect is similar to that caused by differences in the turn-on time. This is illustrated in FIG. 5 where it is seen that, although each GTO is represented as turning on at the same time, the respective currents $I_a$, $I_b$, and $I_c$ have a different rate of increase and rise to different levels.

FIG. 6 illustrates the current differences which may occur if the forward voltage drops across the several GTOs differ. The depiction in FIG. 6 assumes that the GTOs have identical turn-on times and thus the currents are all started identically as illustrated by the forward slope labeled di/dt (1). Once the rise is over, time $t_o$, the currents begin to diverge depending upon the differences in forward voltage drop. The rates at which these currents diverge are dependent upon the value of these differences in forward drop As indicated by the three currents $I_a$, $I_b$, and $I_c$, after time $t_o$, device $G_{1c}$ has the greatest forward voltage drop (or highest path resistance) while device $G_{1a}$ has the lowest voltage drop (or lowest path resistance). A similar result will exist in a case of differences in resistance of the paths associated with each of the GTOs. This has not been separately illustrated.

The approach to be taken to correct an imbalance in the currents in the GTOs, regardless of the cause(s), is to take advantage of the first feature discussed above; that is, to take advantage of the feature that the GTO which turns on first will attain a higher current. Use will also be made of the effect that current change after turn on proceeds at a moderate rate; i.e., the current imbalance established at turn-on will to some extent continue to the end of the 120 degree conduction period. Based upon these premises, the effect of the current balance scheme in accordance with the present invention is shown in FIGS. 7 and 8.

Figure 7:
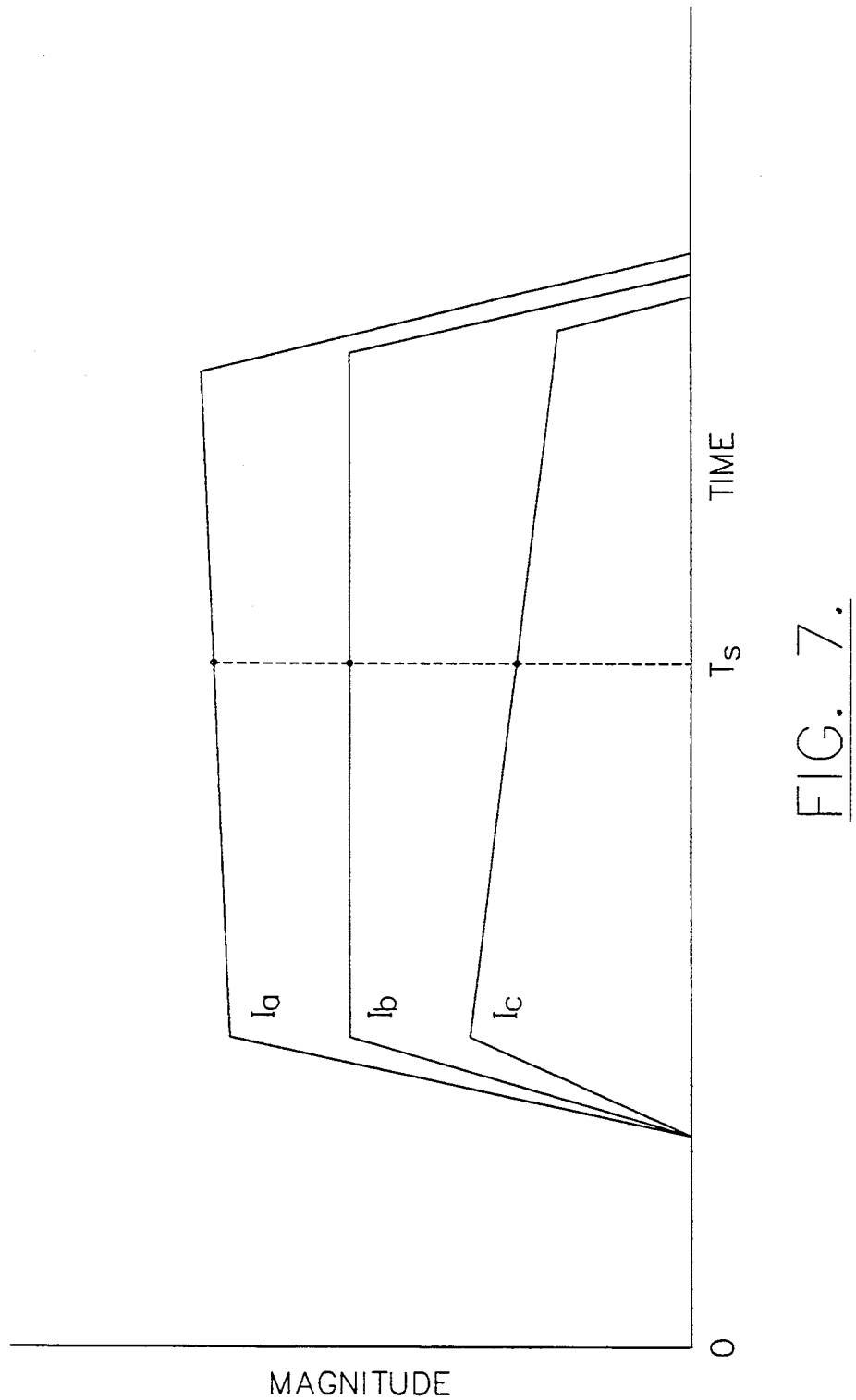
Figure 8:
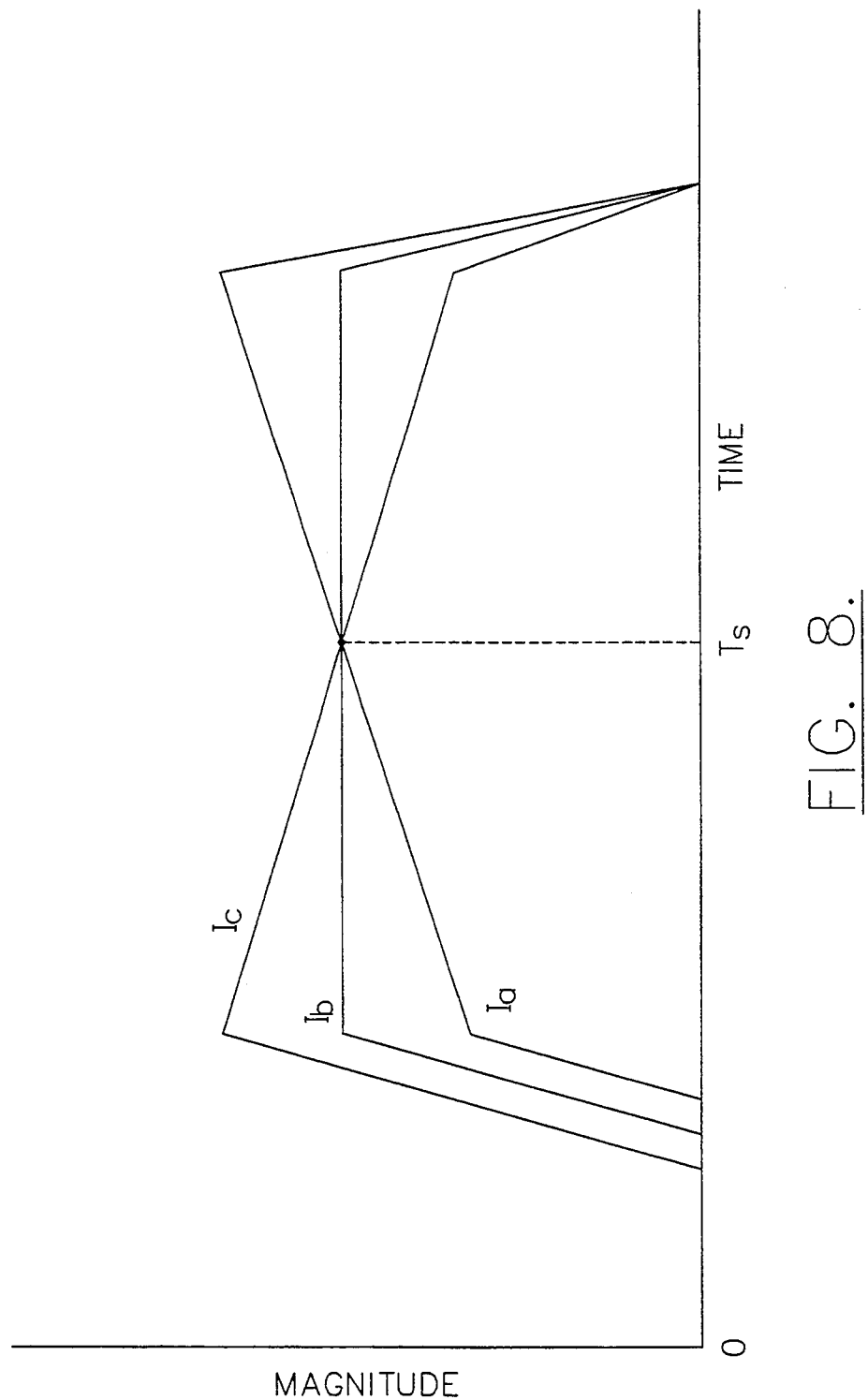

FIG. 7 illustrates a typical current cycle (120 degrees) with varying current imbalances. The depictions of FIGS. 7 and 8 assume that it is desired to maintain an average current balance over the 120 degree substantially coincidental conduction period. Thus, a sampling which will be more fully explained later is performed at the middle of the period, at time $T_s$. At this time, the currents in each of the GTOs under consideration will be sampled (FIG. 7) and the next time this particular set of GTOs is gated on, those GTOs whose current was greater than the average will be gated later than those with an average value while those GTOs whose currents are smaller than the average will be gated on earlier than those with average value. This process continues with each cycle of the particular GTOs in question to make the current values the same at time $T_s$ such that the integrated values of the currents are the same as shown in FIG. 8. The slopes of the currents are more-or-less the same in FIGS. 7 and 8 because these slopes are functions of forward drop and/or resistance and are not adjustable. As indicated, selecting the sampling time $T_s$ in the middle of the conduction period tends to balance the average of the currents over the period. If for some reason it is desired to balance at other times such as to have current balance at turn-off or to allow more current to the cell with the low forward drop to balance losses rather than current, the sampling time can be adjusted accordingly. A late sampling time balances the turn-off current while early sampling time tends to balance cell losses by giving the low forward drop cell a chance to pick up current after time $T_s$.

Figure 9:
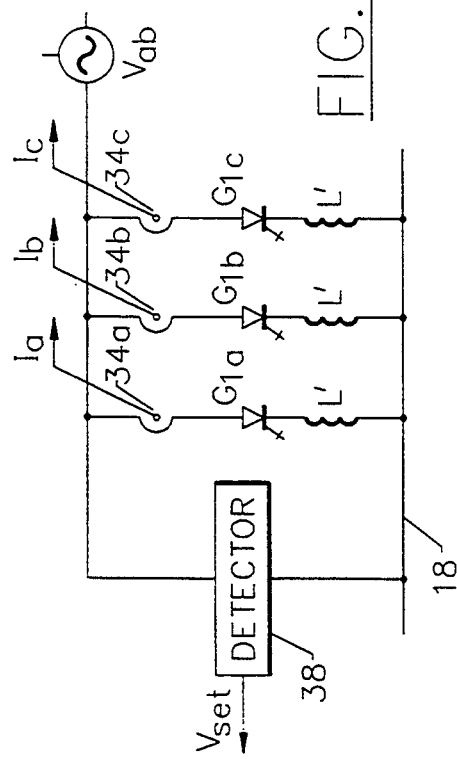
FIG. 9 is a schematic diagram illustrating a portion of FIG. 2 and further illustrating the derivation of certain signals employed in the present invention.

Implementation of the present invention requires signals representing the currents in each of the semiconductors of the set. FIG. 9 shows suitable current sensing means $34_a$, $34_b$ and $34_c$ provided in series with each of the semiconductors of the set ($G_{1a}$, $G_{1b}$, $G_{1c}$) to provide signals representing currents $I_a$, $I_b$ and $I_c$. The sensing devices may be of any suitable type such as current transformers or more accurate devices which will also sense a DC component of a current, such as a "LEM" module, may be used. A "LEM" module is a device employing a Hall Effect crystal and is commercially provided by LIAISONS ÉLECTRONIQUES MÉCANIQUES of Geneve, Switzerland.

The embodiment of the invention to be described also employs a signal termed $V_{set}$ which represents the voltage across the set of GTOs prior to conduction. In FIG. 9, $V_{set}$ is the output of a suitable voltage detector 38 connected between the DC bus and the AC bus associated with a set of GTOs. This bus to bus connection is possible since the critical use time of $V_{set}$ is when there is no current in the GTO. One could, of course, sense the voltage directly across the GTO.

Figure 10:
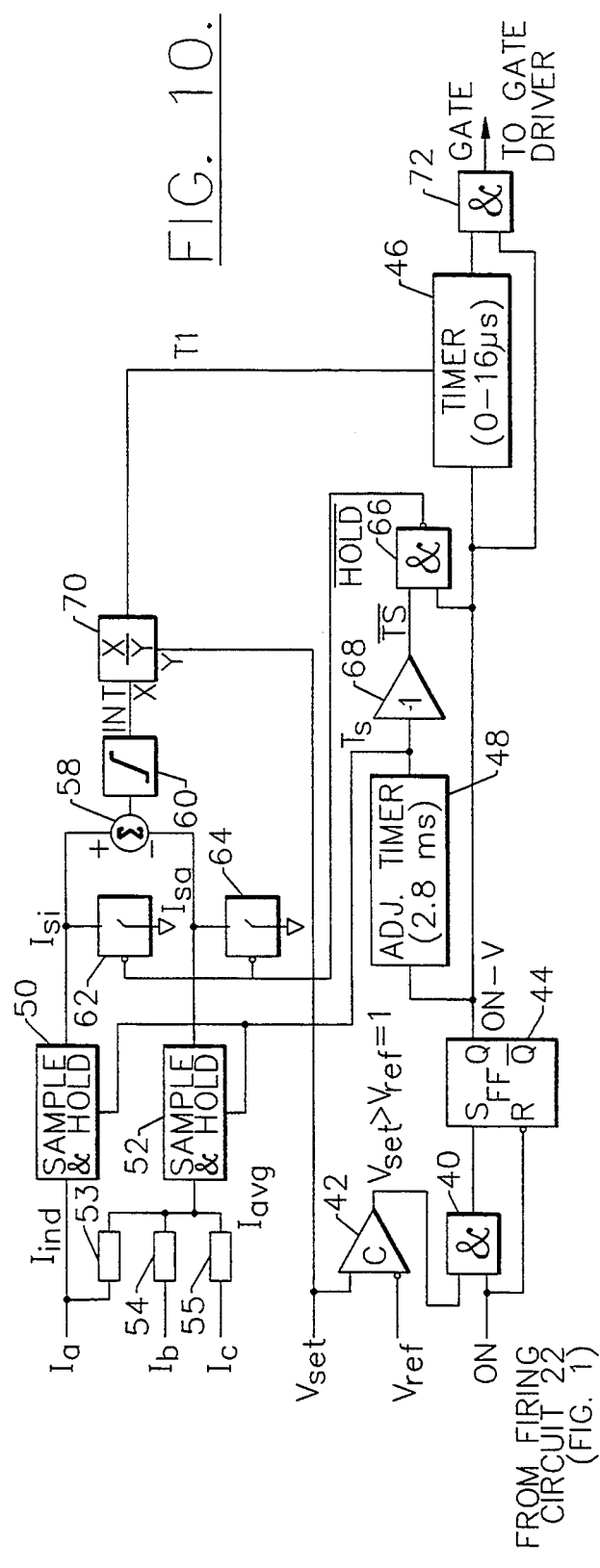
FIG. 10 is a block diagram illustrating an implementation of the present invention in a first preferred embodiment.

The current balance function 26 of FIG. 1, and of the present invention is illustrated in its first embodiment in FIG. 10. Referencing now that figure, a signal ON from the firing circuit 22 (FIG. 1) serves as one input to an AND gate 40 the other input of which is the output of a comparator 42. Comparator 42 receives two inputs, the $V_{set}$ signal, and a $V_{ref}$ signal such that the output of the comparator 42 will be high only when $V_{set}$ exceeds $V_{ref}$. In a typical application employing GTOs the $V_{ref}$ signal would represent a value of 500 volts. The output of AND gate 40 serves as the set input to a flip-flop 44 which has the ON signal applied to an inverting reset terminal R. Thus, flip-flop 44 will provide an output signal ON-V at its Q output terminal so long as the ON signal exists starting with the time that $V_{set}$ exceeds $V_{ref}$. The ON-V signal forms a starting input to a timer 46 to be discussed in greater detail later. The ON-V signal also supplied to an adjustable timer 48 whose output is the time of sampling signal $T_s$, In the example being described the $T_s$ signal occurs at the mid-point of the 120 degree conduction period. Thus, as parenthetically shown, the $T_s$ signal occurs approximately 2.8 milliseconds after the occurrence of the ON-V signal. The $T_s$ signal is first applied to a pair of sample and hold circuits 50 and 52. Sample and hold circuit 50 has applied to it a one of the individual GTO current signals, in this case signal $I_a$. The three signals $I_a$, $I_b$, and $I_c$ are averaged by an averaging circuit comprised of resistors 53, 54 and 55 and that average ($I_{avg}$) is applied to the second sample and hold circuit 52. The output of sample and hold circuit 52 ($I_{sa}$) is provided as the negative input to a summing junction 58 whose output is the input to an integrator 60. The other (positive) input to junction 58 is the output of the sample and hold circuit 50 (designated $I_{si}$). The two currents $I_{si}$ and $I_{sa}$ may be shunted to ground by way of two switches, respectively 62 and 64, which are under the control of a signal $\overline{HOLD}$. The $\overline{HOLD}$ signal is the output of an AND gate 66 the inputs of which are the ON-V signal and the output of an inverter 68 whose input is the $T_s$ signal. Thus the outputs of the sample and hold circuits 50 and 52 will be held at zero to prevent the integrator 60 from changing its output until the appropriate sampling time $T_s$.

The output of integrator 60 is applied as the x input to x/y divider 70. The y input is the $V_{set}$ signal. For the moment let it be assumed that the gain of the divider 70 is unity and thus the output of that divider, signal TI, is applied to the timer 46 to adjust the timing thereof. The output of the timer 46 is applied to an AND gate 72 the second input of which is the ON-V signal. The output of gate 72 is applied to the gate driver 30 (FIG. 1) as the gating signal for the individual GTO being served in this case, $G_{1a}$.

Continuing with the present example for a 60 Hertz system, the ON-V signal is generated by the firing circuit 8 microseconds before the desired turn-on time for the appropriate GTO. Timer 46 provides an 8 microsecond delay for a zero TI input (indicating no difference in the individual and average current values). The total range of timer 46 is from 0 to 16 microseconds and thus the individual GTO may be gated, in accordance with the present example, any time from 8 microseconds before to 8 microseconds after the normal gating time. These are only representative values arbitrarily selected to a particular system. Other values could, of course, be used.

The initial function of the $V_{set}$ signal was to assure that the proper GTO forward voltage was available before the gate timing delay starts. The second function of $V_{set}$ is as the y input to the x/y divider 70. Since $V_{set}$ represents a voltage across the parallel set of GTOs, its magnitude at the instant of turn-on of the GTOs determines the rate of current change (di/dt) of the respective currents. Thus, to make a given current correction, the time needed by timer 46 is inversely proportional to $V_{set}$. By applying $V_{set}$ to the divider 70, time difference resulting from the TI signal is made an inverse function of the $V_{set}$ value.

Figure 11:
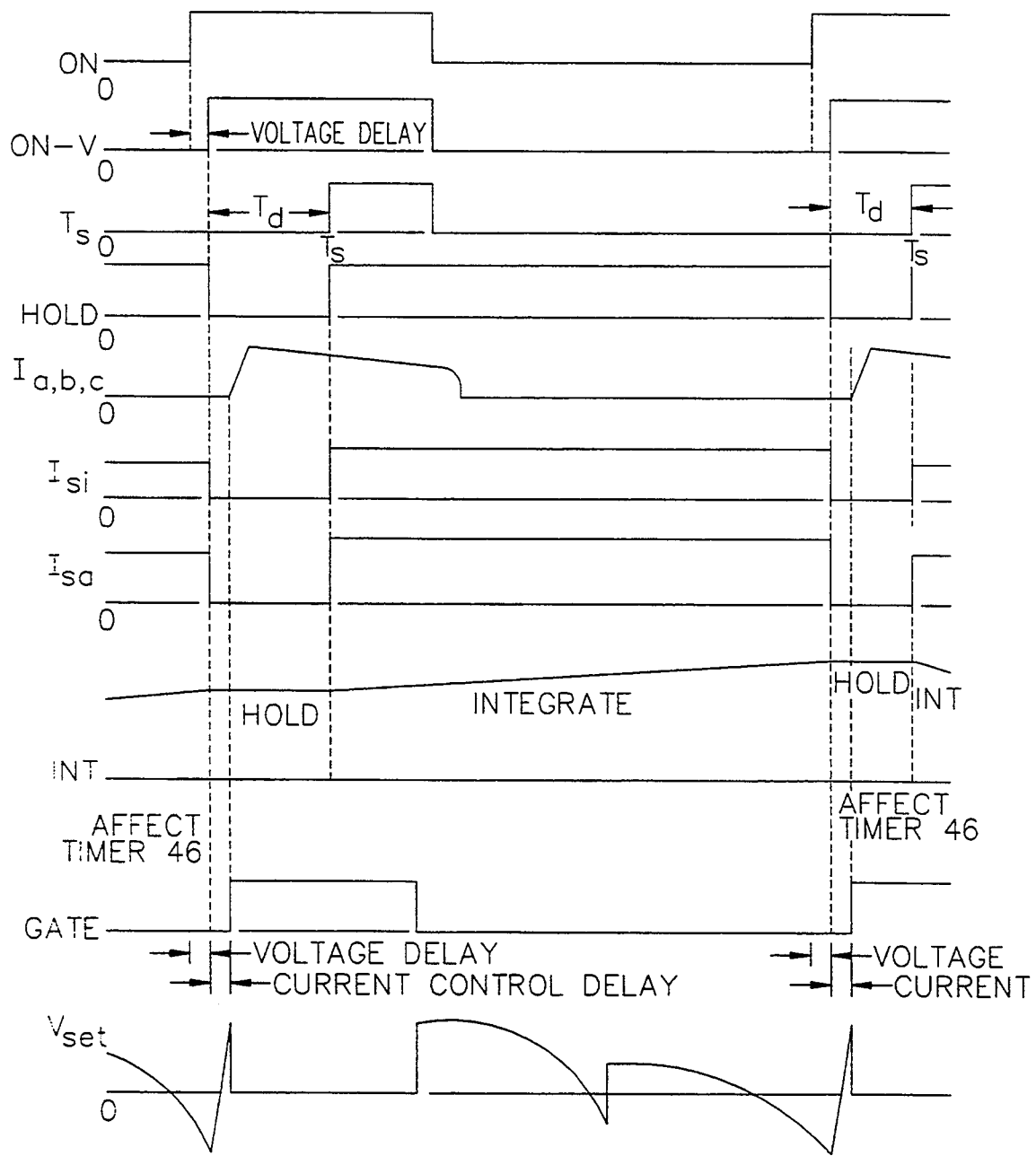
FIG. 11 is a series of traces drawn to the same time base and useful in understanding the operation of the FIG. 10 implementation.

The operation of the circuitry of FIG. 10 is better understood with reference to the several traces of FIG. 11, which are drawn to the same time scale. As shown by the bottom trace, the GTO voltage $V_{set}$ is reversed at the instance of commutation. The utilization of the ON signal, shown at the top of the sheet, is delayed until the $V_{set}$ signal reaches some value, for example 500 volts. The second trace, ON-V, shows this delay. Timer 48 is initiated by the ON-V signal and generates the $T_s$ signal delayed by the time $T_d$, typically 60 electrical degrees or in a case of a 60 Hertz system 2.8 milliseconds. The $T_s$ signal activates the sample and hold circuits 50 and 52 to lock in the respective values of $I_{ind}$ and $I_{avg}$. In the traces this is illustrated by the traces labeled $I_{a, b, c}$, $I_{si}$ and $I_{sa}$. It should be noted that until this time the switches 62 and 64 have been closed and these two switches now open because of the change in state of the output of and gate 66. Thus, the two signals from the sample and hold circuits are furnished as the positive and negative inputs to summing junction 58 whose output is applied to integrator 60 which integrates the difference between the individual current and the average current signals from time $T_s$ until the next GTO is gated on.

Below the trace designated INT (the output of the integrator 60) in FIG. 11, two points are marked "Affect Timer 46". Once the integrator has had its affect on the turn-on time its holds it value (switches 62 and 64 close) until the next current sampling. With a proper gain in the integrator there will be no error in current in the next cycle. The change in gating time generated by the signal sample should correct the current errors unless the operating point changes. If an error remains the integrator will continue to move until current balance is achieved.

Figure 12:
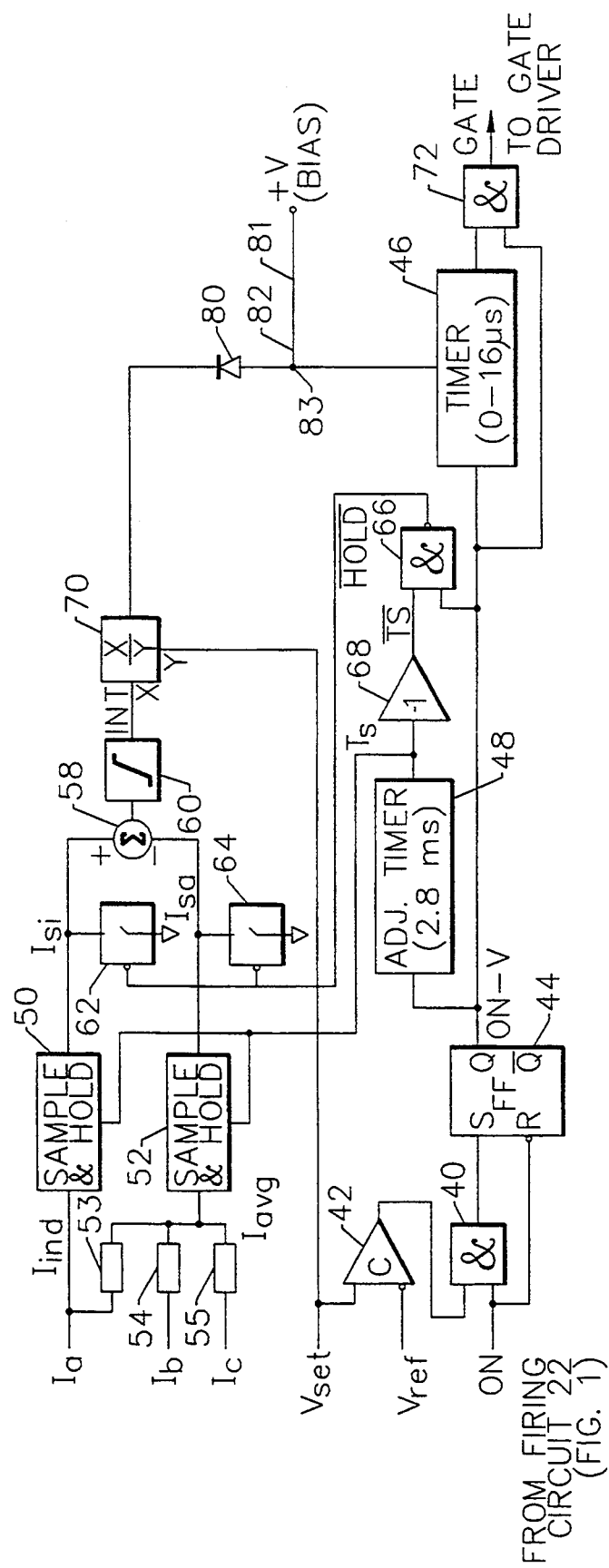
FIG. 12 is a block diagram illustrating the present invention in a second preferred embodiment.

FIG. 12 illustrates a second embodiment of this present invention and it is readily apparent that the implementation as shown in FIG. 12 is very similar to that of FIG. 10. The primary difference in function with this circuit is that, whereas the earlier embodiment allowed the gate signal to be shifted in time in both directions, the embodiment in FIG. 12 permits only delay from the "normal" or standard time. In this case, the circuit difference resides at the output of the divider 70 which is applied to a rectifier 80 which passes only negative voltage. The output of that rectifier 80 is applied to node 83 which receives a +V signal from terminal 81 via line 82. In this instance the bias is sufficient to provide an 8 microsecond delay in timer 46. As such, if there is no error and no output from the integrator, the delay will be 8 microseconds which in accordance with the previous, represents the normal gating time of the GTO. If there is an error indicating a need for delay, then the negative value out of integrator 60 will exceed that of the bias on terminal 81 and result in greater than an 8 microsecond delay. It is, of course, apparent that the bias signal could be eliminated in the FIG. 12 implementation by providing the ON signal at the "normal" time and adjusting the timer to provide for example a zero to 8 microseconds delay.

Figure 13:
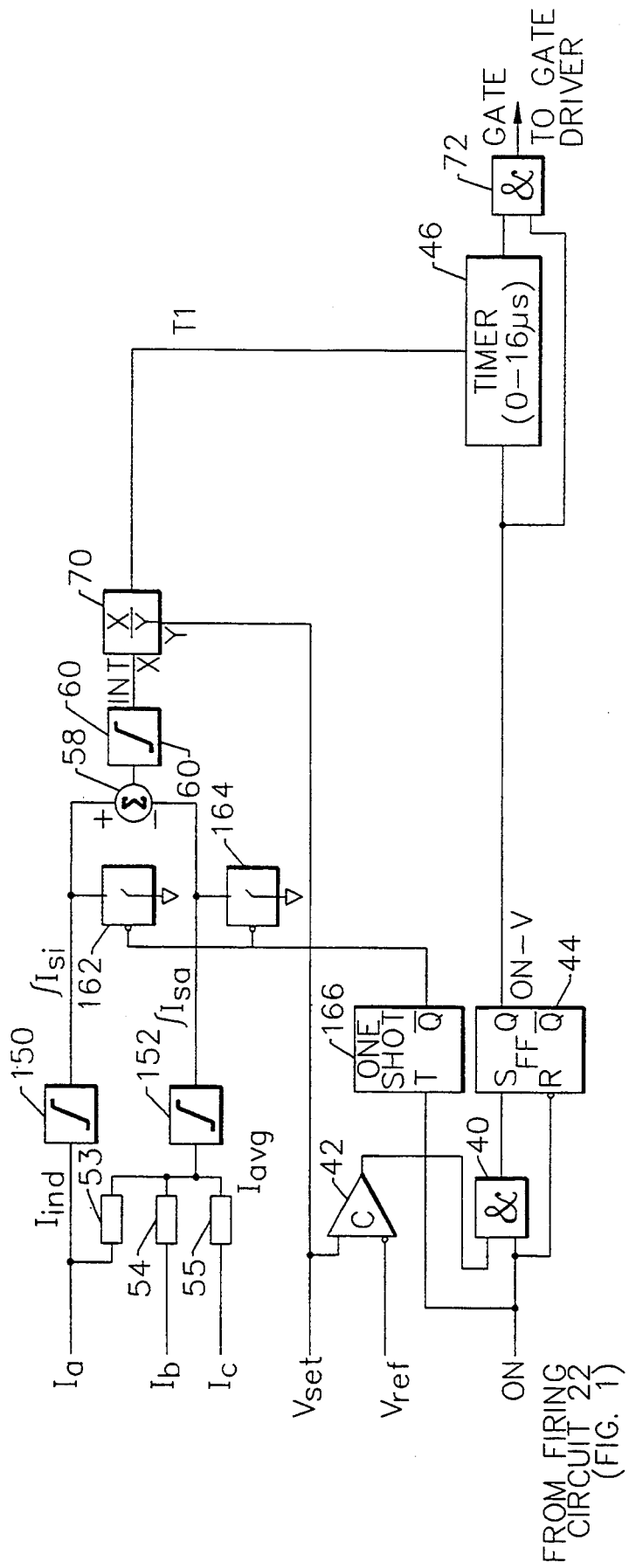
FIG. 13 is a block diagram illustrating the present invention in a third preferred embodiment; and, FIG. 14 is a series of traces drawn to the same time base and useful in understanding the FIG. 13 implementation.
Figure 14:
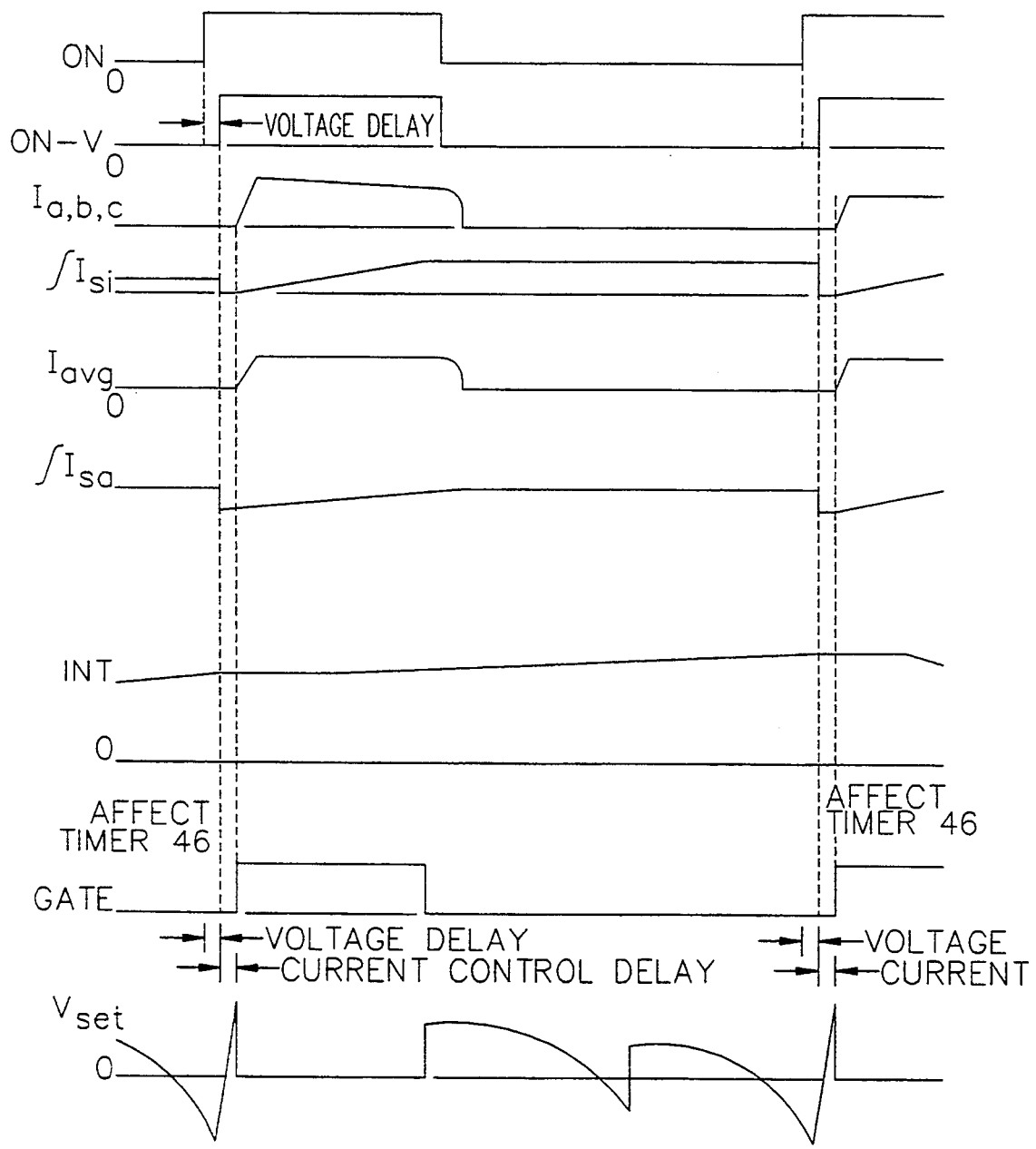

FIG. 13, which is best understood taken with the waveforms of FIG. 14, illustrates another preferred embodiment of the present invention. In FIG. 13 the sample and hold circuits 50 and 52 of the earlier embodiments are replaced, respectively, by integrators 150 and 152. The outputs of the two integrators are respectively, the integrated values of the individual and average currents; i.e., $\int I_{si}$ and $\int I_{sa}$. The former value forms the positive input to a summing junction 58 while the latter value forms the negative input to junction 58.

The integrators 150 and 152 may be periodically reset, as illustrated by the switches 162 and 164 which, when closed, connect the two integrated values to ground. Switches 162 and 164 are operated in response to the $\overline{Q}$ output of a monostable multivibrator or "one shot" 166 which receives at its trigger input the ON signal from the firing circuit 22 (FIG. 1). One shot 166 develops a very narrow pulse (for example, 5 microseconds) at the beginning of each conduction period to close switches 162 and 164 and reset the integrators 150 and 152.

In this embodiment, as is better understood with reference to the traces of FIG. 14, it is the function of integrators 150 and 152 to measure current values during the extant conduction period and, by way of summing junction 58, to provide to integrator 60 any difference in the values $\int I_{si}$ and $\int I_{sa}$ during this period.

The function of integrator 60, whose output is the signal INT, is to remember past errors in current and combine those cumulative past errors with any presently determined error to provide correction for subsequent conduction periods.

It is noted that this embodiment does not employ timer 48, inverter 68 and gate 66 included in the FIG. 10 embodiment. It is also to be noted this embodiment could be utilized in the embodiment of FIG. 12.

Figure 15:
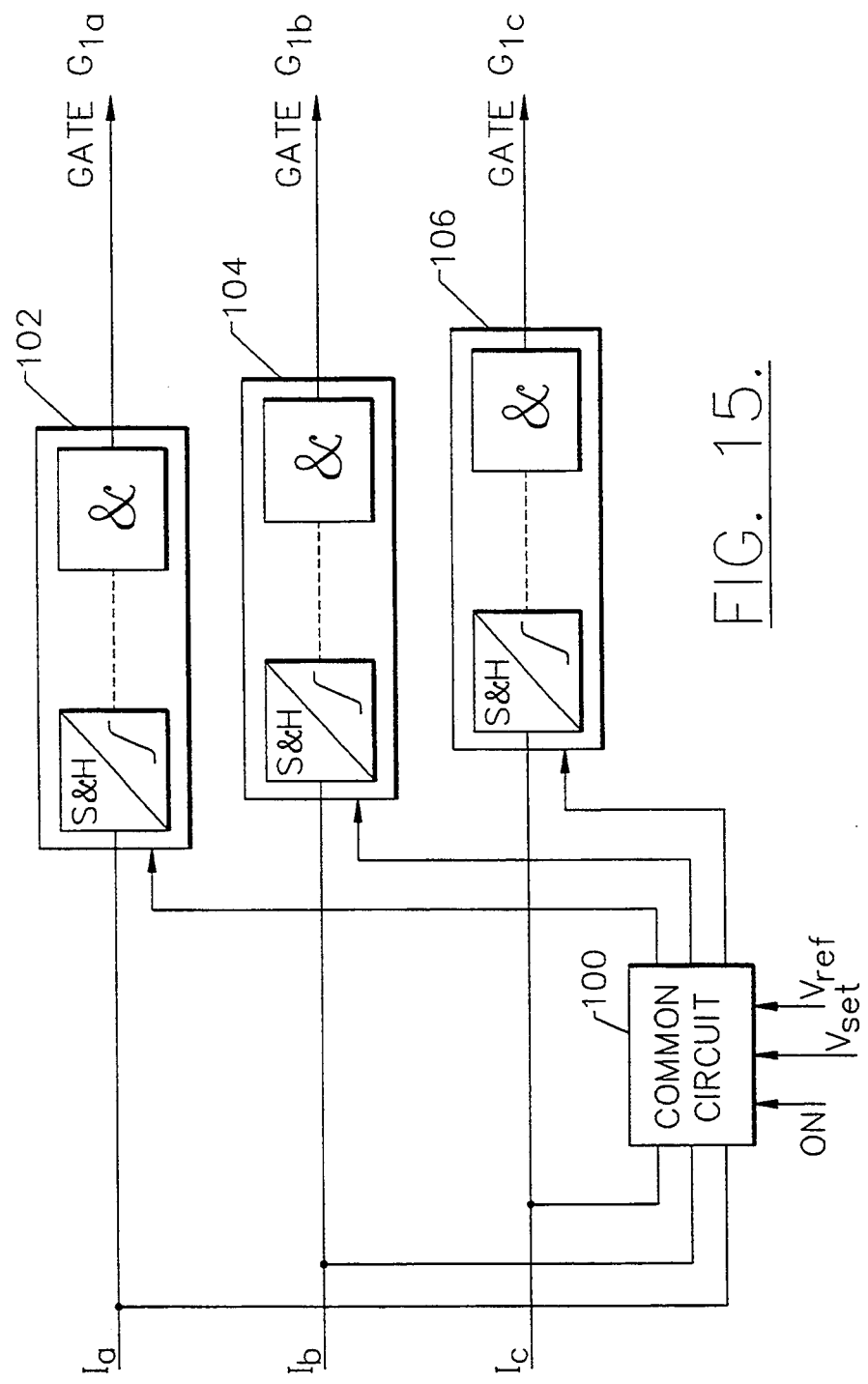
FIG. 15 is a block diagram illustrating the application of the invention concept to a system having three paralleled switching devices.

In each of the embodiments much of the circuitry serves the entire array of GTOs within the plurality or the parallel set. All functions dealing with the voltage and average current are central to the array. Thus, the only functions which are duplicated on an individual GTO (switching device) basis are, in FIG. 10, the sample and hold circuit associated with the individual (i.e., sample and hold 50 in the illustrated embodiment) switch 62, integrator 60, divider 70, timer 46, and gate 72. The rest of the functions serve the entire array. In the FIG. 12 embodiment, rectifier 80 and bias circuit have been added while in FIG. 13 the sample and hold circuit 50 is replaced by integrator 150. This concept is illustrated in FIG. 15 which shows a common circuit 100 and three individual circuits 102, 104 and 106 each including a sample and hold circuit (e.g. circuit 50 or integrator 150 and extending to an and gate (e.g. gate 72).

While the present invention has been described in its preferred embodiments, the modifications thereto will readily occur to those skilled in the art. The applicability to switching devices other than GTOs has been previously mentioned as has the fact that the concepts are applicable to parallel arrays of lesser or greater numbers than the illustrated three. It has also been noted that the single switching device in each parallel leg could be replaced by plural devices in series. It is to be specifically recognized that although analog implementations, which are better able to give an understanding of the invention, have been illustrated, digital equivalents (using, for example, counters for the integrating functions, etc.) are clearly considered to be within the scope of the invention as claimed. It is also recognized that, while an AC voltage source and a DC current source have been selected for purposes of illustration, the nature of the sources is not critical to the invention. That is, both sources could be either AC or DC or the current source could be AC with a DC voltage source. It is not desired, therefore, that the invention be limited to the specific embodiments shown and described and it is intended to include, within the appended claims, all such modifications as fall within the true spirit and scope of the invention.

What is claimed is:

1. For transferring electrical power between two electrical power sources, a switching arrangement comprising:
   a) at least one plurality of series connections each comprising a switching device and an inductor, the series connections being connected in parallel with the parallel combination being connected between said two power sources;
   b) means to control the conductive state of said switching devices to effect periods of simultaneous current within each of the series connections alternating with periods of no current within said connections;
   c) means to provide individual current signals representing the respective currents in each of the simultaneously conducting devices of said plurality;
   d) means to provide an average current signal representing the average value of said individual current signals;
   e) means to develop a difference signal as a function of the difference between the respective individual current signal and the average current signal;
   f) means to integrate said difference signal to provide an integrated signal;
   f) means to generate control signals operative to render conductive associated ones of said switching devices; and,
   g) means responsive to said integrated signal to vary the time, with respect to a predetermined norm of associated devices, of application of said control signal to the associated ones of said devices whereby differences in current value within said devices are reduced.

2. For transferring electrical power between two electrical power sources, a switching arrangement comprising:
   a) at least one plurality of series connections each comprising a switching device and an inductor, the series connections being connected in parallel with the parallel combination being connected between said two power sources;
   b) means to control the conductive state of said switching devices to effect periods of simultaneous current within each of the series connections alternating with periods of no current within said connections;
   c) means to provide individual current signals representing the respective currents in each of the simultaneously conducting devices of said plurality;
   d) means to provide an average current signal representing the average value of said individual current signals;
   e) means to develop a difference signal, with respect to each of said individual current signals, as a function of the difference between the respective individual current signal and the average current signal;
   f) means to generate control signals operative to render conductive associated ones of said switching devices; and
   g) means responsive to the difference signal to vary the time, with respect to a predetermined norm of associated devices, of application of said control signal to the associated ones of said devices whereby differences in current value within said devices are reduced.

3. The invention in accordance with claim 2 wherein said means responsive to the difference signal includes timing means responsive to each of the difference signal to adjust, respectively in response thereto, the time of application of said control signals.

4. The invention in accordance with claim 3 wherein said timing means adjust the timing of said control signals in a manner to selectively lead or lag the time of the predetermined norm of the associated devices of developing said control signals.

5. The invention in accordance with claim 3 wherein said timing means provides a delay in providing said control signals with respect to the time of the predetermined norm of the associated devices of developing said control signals.

6. The invention in accordance with claim 3 further including means to generate a voltage signal representative of the voltage across said plurality of switching devices prior to their becoming conductive and gain means responsive to said voltage signal to vary the value of said difference signal prior to the application thereof to said timing means.

7. In a power switching system of the type having at least one leg connected between two power sources, each leg comprising a plurality of respective series connections being connected in parallel with each other, each of the series connections comprising a switching device and a respective inductor, each switching device being operable in successive control cycles so that the switching device is in a conductive state for a first time period of each control cycle and in a nonconductive state for a second time period of each control cycle to cause current to flow in the series connection during the first time period and to prevent current from flowing during the second time period, a method of controlling the switching devices in a respective leg to enhance current balance within the plurality of series connections and comprising the steps of:
 a) selectively controlling the conductive state of each of the switching devices during each control cycle by applying respective control signals to each of the switching devices to effect substantially coincident respective first time periods of simultaneously current flow in all of the series connections alternating with respective second time periods of no current flow;
 b) generating a respective individual current signal representative of current flow within each of the series connections during respective first time periods of simultaneous current flow;
 c) generating an average current signal representative of the average current flow within the series connections based upon the individual current signals;
 d) generating a respective difference signal as a function of the difference between each of the individual current signals and the average current signal; and
 e) selectively adjusting relative timing of the application of respective control signals to respective switching devices during respective first time periods of current flow during a control cycle responsive to respective difference signals from a prior control cycle to thereby enhance current balance within the plurality of series connections of the respective leg of the power switching system.

8. The invention in accordance with claim 7 wherein the step of generating a difference signal involves the steps of:
 a) combining the one of said individual current signals and said average current signal at a prescribed point in time to develop an error signal; and,
 b) integrating said error signal to achieve said difference signal.

9. The invention in accordance with claim 8 wherein said prescribed point in time is defined by delaying a predetermined period after the nominal time of initiating current conduction in said plurality.

10. The invention in accordance with claim 9 further including the steps of:
 a) providing a voltage signal proportional to the forward voltage across said plurality; and,
 b) modifying the effect of said difference signal as a function of said voltage signal.

11. The invention in accordance with claim 8 further including the steps of:
 a) providing a voltage signal proportional to the forward voltage across said plurality; and,
 b) modifying the effect of said difference signal as a function of said voltage signal.

12. The invention in accordance with claim 8 wherein said prescribed point in time is defined by;
 a) determining that a forward voltage across said plurality exceeds a predetermined minimum and;
 b) delaying a predetermined period after the determining step.

13. The invention in accordance with claim 12 further including the steps of:
 a) providing a voltage signal proportional to the forward voltage across said plurality; and,
 b) modifying the effect of said difference signal as a function of said voltage signal.

14. The invention in accordance with claim 7 wherein the steps of generating a difference signal and adjusting of time are performed separately for each of the series connections of said plurality.

15. The invention in accordance with claim 7 wherein:
 a) in response to a difference signal of substantially zero magnitude from a prior control cycle, the next control signal is applied to the associated one of said devices at a first point in time;
 b) in response to a difference signal indicating a larger than average current from a prior control cycle, the next control signal is applied to the associated one of said devices at a point in time delayed from said first point in time; and,
 c) in response to a difference signal indicating a smaller than average current from a prior control cycle, the next control signal is applied at a point in time before said first point in time.

16. The invention in accordance with claim 15 wherein the amounts of time before and after said first point in time are proportional to the magnitude of the respective difference signals.

17. The invention in accordance with claim 7 further including the steps of:
 a) providing a voltage signal proportional to the forward voltage across said plurality; and,
 b) modifying the effect of said difference signal as a function of said voltage signal.

18. The invention in accordance with claim 7 wherein only difference signals representing a larger than average current value from a prior control cycle are recognized and wherein said step of adjusting is effective only to individual ones of said devices associated with such difference signals and serves to delay in time the application of the next control signal from a normal time of applying said control signal.

19. The invention in accordance with claim 18 wherein the amount of delay in time is proportional to the value of said difference signal.

20. The invention in accordance with claim 7 wherein the step of generating a difference signal comprises:
 a) integrating one of said individual current signals during a first time period of a first control cycle to provide a first integrated current signals to generate an error signal for said first control cycle; and
 d) respectively integrating the error signal developed on successive control cycles for said plurality to generate said difference signal.

21. The invention in accordance with claim 20 wherein said steps of generating a difference signal and adjusting of time are performed separately for each of the devices of said plurality.

22. The invention in accordance with claim 20 further including the steps of:
   a) providing a voltage signal proportional to the forward voltage across said plurality; and,
   b) modifying the effect of said difference signal as a function of said voltage signal.

23. For transferring electrical power between two electrical power sources, a switching arrangement comprising:
   a) at least one plurality of series connections being connected in parallel with each other and with the parallel combination being connected between the two power sources, each switching device being operable in a conductive state, during which current flows in the series connection, and a nonconductive state, during which no current flows in the series connection;
   b) means for controlling the conductive state of said switching devices in successive control cycles by application of respective control signals to said switching devices to effect substantially coincident first time periods of simultaneous current flow within all of the series connections alternating with second time periods of no current flow;
   c) means for providing individual current signals representing the respective currents in each of the switching devices during respective first time periods of simultaneous current flow;
   d) means for providing an average current signal representative of the average current flow within the series connections based upon said individual current signals;
   e) means for providing a difference signal, as a function of the difference between an individual current signal and the average current signal; and
   f) means cooperating with said control means for selectively adjusting relative timing of the application of respective control signals to respective switching devices during respective first time periods of current flow in a control cycle responsive to respective difference signals from a prior control cycle to thereby enhance current balance within said plurality of series connections.

24. The invention in accordance with claim 23 wherein said switching devices are thyristors.

25. The invention in accordance with claim 24 wherein said thyristors are the gate turn-off type.

26. The invention in accordance with claim 23 wherein said means for developing a difference signal includes adjustable delay means for determining the time of developing said difference signal.

27. The invention in accordance with claim 26 wherein said delay means includes a timer and a sample and hold circuit for each of said individual current signals and said average current signal.

28. The invention in accordance with claim 27 wherein said delay means is adjustable to provide an output to determine the time of applying the content of said sample and hold circuits.

29. The invention in accordance with claim 27 further including means to generate a voltage signal representative of the voltage across said plurality of switching devices prior to their becoming conductive and means to prevent the initiation of the operation of said delay means until said voltage signal reaches a predetermined magnitude.

30. The invention in accordance with claim 23 wherein said means for providing the difference signal comprises:
   a) first integrating means responsive to the individual current signals during a control cycle for providing a first integrated current signal;
   b) second integrating means responsive to said average current signal during said control cycle for providing a second integrated current signal; and
   c) means to combine said first and second integrated signals for providing said difference signal as a function of a difference therebetween.

31. The invention in accordance with claim 30 wherein said means responsive to said difference signal includes means to integrate said difference signal to yield an integrated signal and wherein said integrated signal is employed to effect the time variation.

32. The invention in accordance with claim 31 wherein the difference signal is duplicated for each of the plurality of switching devices.

33. The invention in accordance with claim 30 wherein the difference signal is duplicated for each of the plurality of switching devices.

* * * * *